(12) United States Patent
Hunter

(10) Patent No.: US 6,967,760 B2
(45) Date of Patent: Nov. 22, 2005

(54) INTEGRATED DRIVER PROCESS FLOW

(75) Inventor: James A. Hunter, Campbell, CA (US)

(73) Assignee: Silicon Light Machines Corporation, Sunnyvale, CA (US)

( * ) Notice: Subject to any disclaimer, the term of this patent is extended or adjusted under 35 U.S.C. 154(b) by 0 days.

(21) Appl. No.: 10/703,827

(22) Filed: Nov. 7, 2003

(65) Prior Publication Data

US 2004/0109215 A1 Jun. 10, 2004

Related U.S. Application Data

(63) Continuation of application No. 10/161,191, filed on May 28, 2002, now Pat. No. 6,767,751.

(51) Int. Cl.$^7$ .............................. G02F 1/03; G02F 1/07

(52) U.S. Cl. ........................ 359/245; 359/237; 359/224

(58) Field of Search ............................... 359/237, 245, 359/572, 290–1, 838, 847, 862, 214, 224, 359/230, 298, 302, 311; 438/5–13, 141, 48, 438/57, 69, 622, 778, 942, 53; 257/258, 59, 257/72, 418, 420; 347/134–5; 349/19, 25, 349/30; 73/514.17, 715, 504.09, 541.17; 216/2

(56) References Cited

U.S. PATENT DOCUMENTS

| | | | | |
|---|---|---|---|---|
| 5,808,797 A | * | 9/1998 | Bloom et al. | 359/572 |
| 6,356,378 B1 | * | 3/2002 | Huibers | 359/291 |
| 6,569,717 B1 | * | 5/2003 | Murade | 438/149 |
| 6,798,550 B1 | * | 9/2004 | Wang et al. | 359/245 |
| 2002/0057486 A1 | * | 5/2002 | Tanaka | 359/292 |

* cited by examiner

*Primary Examiner*—Jordan M. Schwartz
*Assistant Examiner*—Jessica Stultz
(74) *Attorney, Agent, or Firm*—Okamoto & Benedicto LLP

(57) ABSTRACT

An integrated device including one or more device drivers and a diffractive light modulator monolithically coupled to the one or more driver circuits. The one or more driver circuits are configured to process received control signals and to transmit the processed control signals to the diffractive light modulator. A method of fabricating the integrated device preferably comprises fabricating a front-end portion for each of a plurality of transistors, isolating the front-end portions of the plurality of transistors, fabricating a front-end portion of a diffractive light modulator, isolating the front end portion of the diffractive light modulator, fabricating interconnects for the plurality of transistors, applying an open array mask and wet etch to access the diffractive light modulator, and fabricating a back-end portion of the diffractive light modulator, thereby monolithically coupling the diffractive light modulator and the plurality of transistors.

16 Claims, 7 Drawing Sheets

INTEGRATED DRIVER PROCESS FLOW

REFERENCE TO RELATED APPLICATION

The present application is a continuation of U.S. application Ser. No. 10/161,191, entitled "Integrated Driver Process Flow," filed on May 28, 2002 now U.S. Pat. No. 6,767,751 by James A. Hunter.

FIELD OF THE INVENTION

The present invention relates to a method of and an apparatus for integration of a light modulator and device drivers. More particularly, this invention is for monolithically integrating a diffractive light grating and associated device drivers on the same chip.

BACKGROUND OF THE INVENTION

A diffractive light grating is used to modulate an incident beam of light. One such diffractive light grating is a grating light valve™ light modulator. Device drivers provide control signals to the grating light valve™ light modulator, which instruct the grating light valve™ light modulator to appropriately modulate the light beam incident thereto. The grating light valve™ light modulator is connected to the device drivers via wire bonds, where each wire bond is connected to one bond pad on the grating light valve™ light modulator and a corresponding bond pad on the device drivers. A conventional grating light valve™ light modulator assembly, as illustrated in FIG. 1, consists of a grating light valve™ light modulator chip 10 and four separate driver die 12, 14, 16 and 18. Each driver die 12, 14, 16 and 18 is coupled to the grating light valve™ light modulator chip 10 by a plurality of wire bonds 11. The grating light valve™ light modulator is built on its own process on silicon. The grating light valve™ light modulator includes moveable elements and each element is connected to a corresponding bond pad. The grating light valve™ light modulator is an essentially passive device where voltage is applied to make the elements move. In contrast, the device drivers are active. Each of the device drivers includes a plurality of transistors with appropriate layers of interconnects. The device drivers receive digital data and convert it to an analog response in the form of analog voltage. The analog voltage is then applied to the appropriate bond pad, which is then received by the corresponding element on the grating light valve™ light modulator, thereby dictating the movement of the various elements.

In the field of light modulating devices, each element on the grating light valve™ light modulator corresponds to a pixel within the light modulating device. For example, in the case of 1088 pixels, 1088 wire bonds are needed as input to the grating light valve™ light modulator from the device drivers. 1088 wire bonds requires 272 bond pads on the output side of each of the four device drivers. However, it is much easier to perform high density wiring using standard semiconductor processing steps then it is to do wire bonding. Since only 60–70 wire bonds are necessary on the input side of each of the device drivers, it would be advantageous to internally wire the connections between the device drivers and the grating light valve™ light modulator on the same chip. In this manner, it would only be necessary to have the 60–70 wire bonds as inputs to this integrated chip, thereby eliminating the additional 1088 wire bonds of the conventional grating light valve™ light modulator assembly. By reducing the number of wire bonds, the manufacturing process is made easier. Further, fewer wire bonds reduces the packaging cost of each device. Still further, by eliminating the wire bonds between the device drivers designs whose functionality and/or speed was previously limited by the parasitic capacitance of the wire bonds can now be used.

There is also a reliability problem associated with such a high number of wire bonds. Since there is a finite failure rate associated with each wire bond, the more wire bonds there are, the greater the chance that one of the wire bonds will fail. Reducing the number of wire bonds would necessarily reduce the number of failing wire bonds, and increase the reliability of the device.

Physically, each bond pad leaves a footprint. As such, the size of the grating light valve™ light modulator assembly is determined in great part by the total number of bond pads. If the number of bond pads is reduced, the size of the grating light valve™ light modulator assembly can also be reduced. As the device is bond pad limited, there is a significant amount of wasted real estate. Since this wasted real estate exists on silicon, which can be used to manufacture the devise drivers, the device drivers could be manufactured on the real estate currently being used by the bond pads.

Electro-static discharge (ESD) protection is usually incorporated into active devices ranging from diodes to transistors and integrated circuits. It is a matter of layout and design to add ESD protection structures to the pad during transistor fabrication on the integrated circuits. This protection prevents the circuitry from being damaged by ESD. However, since there is no active device on the grating light valve™ light modulator chip, there is no ESD protection. As a result, a significant amount of yield is lost during manufacturing of the grating light valve™ light modulators due to ESD induced "snap-downs." In a snap-down, the pad on the grating light valve™ light modulator acts as an antenna and sees an ESD event. The ESD event is regarded as a voltage by the element on the grating light valve™ light modulator and the element is snapped down thereby destroying itself. It would be advantageous to incorporate ESD protection into the normal manufacturing process of the grating light valve™ light modulator.

Considering the above shortcomings, it is clear that if the device drivers are integrated onto the same silicon monolithically with the grating light valve™ light modulator, then this would produce a significant advantage.

Unfortunately, the manufacturing processes of the device drivers and the grating light valve™ light modulator are not the same. Further, by integrating the device drivers and the grating light valve™ light modulator onto the same silicon substrate, significant manufacturing problems are introduced.

Conventional transistor manufacturing processes are described below in relation to FIGS. 2 and 3. FIG. 2 illustrates an exemplary transistor used in the device drivers of the grating light valve™ light modulator assembly. The transistor illustrated in FIG. 2 is early in the manufacturing process and is often referred to as the front-end of the transistor. In a first step, silicon dioxide films 22 are grown on a silicon substrate 20. Next, a gate 24 and source-drain 26 are added by manufacturing processes that are well known in the art of semiconductor fabrication. A next step, as illustrated in FIG. 3, is deposition of an oxide layer 30 over the front-end of the transistor. The oxide layer 30 is then planarized, typically by a chemical-mechanical polishing technique. Contact holes are then etched in the oxide layer 30 to access the gate 24 and the silicon substrate 20, for example. Metalization is performed for the wiring of the device drivers. Metalization is typically performed by sputtering a metal layer over the oxide layer 30, patterning and etching the metal layer to form contacts 32 and 34.

Another oxide layer 36 is then deposited and planarized. Contact holes are etched in the oxide layer 36 to access the contacts 32 and 34. Metalization is then performed to form the contacts 38 and 40. Additional layers of oxide and metalization are added as determined by the design considerations of the device. Typically, there are 3–5 layers of metal which form the interconnects of the device drivers.

Conventional grating light valve™ light modulator manufacturing processes are described below in relation to FIGS. 4–7. The first step, as illustrated in FIG. 4, is the deposition of an insulating layer 51 followed by the deposition of a sacrificial layer 52 and a low-stress silicon nitride film 54 on a silicon substrate 56.

In a second step, as illustrated in FIG. 5, the silicon nitride film 54 is lithographically patterned into a grid of grating elements in the form of elongated elements 58. After this lithographic patterning process, a peripheral silicon nitride frame 60 remains around the entire perimeter of the upper surface of the silicon substrate 56. After the patterning process of the second step, the sacrificial layer 52 is etched, resulting in the configuration illustrated in FIG. 6. It can be seen that each element 58 now forms a free standing silicon nitride bridge. As can further be seen from FIG. 6, the sacrificial layer 52 is not entirely etched away below the frame 60 and so the frame 60 is supported above the silicon substrate 56 by this remaining portion of the sacrificial layer 52.

The last fabrication step, as illustrated in FIG. 7, is sputtering of an aluminum film 62 to enhance the reflectance of both the elements 58 and the substrate 56 and to provide a first electrode for applying a voltage between the elements and the substrate. A second electrode is formed by sputtering an aluminum film 64 onto the base of the silicon substrate 56. Alternatively, the second electrode can be introduced earlier in the process by sputtering an aluminum film onto the upper portion of the silicon substrate 56 prior to deposition of the insulating layer 51.

In FIGS. 8–9, an alternative embodiment of a conventional grating light valve™ light modulator is illustrated. In this embodiment of the grating light valve™ light modulator consists of a plurality of equally spaced, equally sized, fixed elements 72 and a plurality of equally spaced, equally sized, fixed elements 72 and a plurality of equally spaced, equally sized, fixed elements 74 in which the movable elements 74 lie in the spaces between the fixed elements 72. Each fixed element 72 is supported on and held in position by a body of supporting material 76, which runs the entire length of the fixed element 72. The bodies of material 76 are formed during a lithographic etching process in which the material between the bodies 76 is removed.

The problem is how to manufacture the grating light valve™ light modulator on the same chip as the transistors that comprise the device drivers. Combining a grating light valve™ light modulator and its associated device drivers onto a monolithically integrated device using conventional manufacturing process steps would be advantageous.

SUMMARY OF THE INVENTION

The present invention includes an embodiment of a method of fabricating an integrated device. The method preferably comprises fabricating a front-end portion for each of a plurality of transistors, isolating the front-end portions of the plurality of transistors, fabricating a front-end portion of a diffractive light modulator, isolating the front end portion of the diffractive light modulator, fabricating interconnects for the plurality of transistors, applying an open array mask and wet etch to access the diffractive light modulator, and fabricating a back-end portion of the diffractive light modulator, thereby monolithically coupling the diffractive light modulator and the plurality of transistors. The plurality of transistors and the associated interconnects can form one or more device drivers configured to process received control signals and to transmit the processed control signals to the diffractive light modulator. Fabricating the front-end portion of the diffractive light modulator and fabricating the front-end portions for the plurality of transistors can be performed using high temperature processing steps. Fabricating interconnects and fabricating the back-end portion of the diffractive light modulator can be performed using low temperature processing steps. Isolating the front-end portions of the plurality of transistors can include depositing an oxide layer over the front-end portions of the plurality of transistors, and planarizing the oxide layer. Isolating the front-end portion of the diffractive light modulator can include depositing an oxide layer over the front-end portion of the diffractive light modulator, and planarizing the oxide layer.

Fabricating the interconnects can include fabricating one or more metal layers. The preferred method can also include removing metal from above the diffractive light modulator after each metal layer is fabricated. Each metal layer can be removed from above the diffractive light modulator by over-etching and the oxide layer deposited over the front-end portion of the diffractive light modulator is sufficiently thick as to allow for over-etching without damaging the front-end portion of the diffractive light modulator. The interconnects for the plurality of transistors can include contacts to each of the plurality of transistors. The contacts can include a maximum aspect ratio that limits a maximum combined thickness of the oxide layer over the front-end portions of the plurality of transistors and the oxide layer over the front end portion of the diffractive light modulator. The diffractive light modulator and the plurality of transistors are monolithically coupled to transmit control signals from the plurality of transistors to the diffractive light modulator such that the diffractive light modulator modulates an incident light beam in response to the control signals. The wet etch preferably comprises about a 10:1 buffered oxide wet etch to selectively etch the layers above the diffractive light modulator.

The present invention includes an embodiment of an integrated device. The integrated device includes one or more device drivers and a diffractive light modulator monolithically coupled to the one or more driver circuits. The one or more driver circuits are preferably configured to process received control signals and to transmit the processed control signals to the diffractive light modulator.

DETAILED DESCRIPTION OF THE EMBODIMENTS

The fabrication steps required to produce a monolithically integrated diffractive light grating and device drivers according to the preferred embodiment of the present invention are illustrated in FIGS. 10–20. Specifically, the fabrication process begins with a front-end fabrication process, which is illustrated in FIGS. 10–14. The fabrication process is completed with a back-end fabrication process, which is illustrated in FIGS. 15–20. The front-end fabrication process includes fabrication of the front-end of the transistors, which form the device drivers and fabrication of the front-end of the diffractive light grating. The fabrication of the front-end of the transistors and the front-end of the diffractive light grating are performed using high-temperature process steps. The back-end fabrication process includes the metalization of the transistor interconnects and the metalization of the diffractive light grating. Metalization is performed using low-temperature process steps. The total thermal budget associated with the fabrication of the monolithically integrated device must take into consideration the thermal budgets associated with each of the high-temperature process steps as well as each of the low-temperature process steps.

Figure 1:
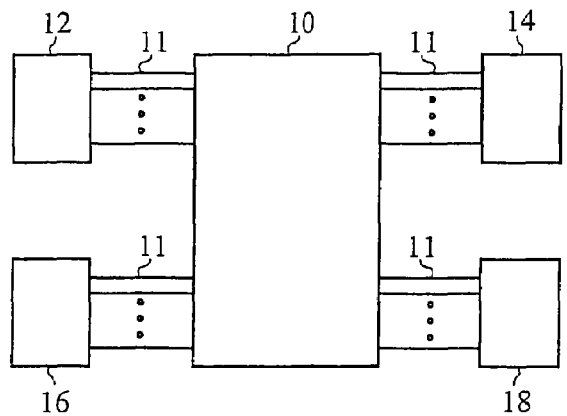
FIG. 1 illustrates a conventional component configuration in which a diffractive light grating is connected to separate device drivers.
Figure 2:
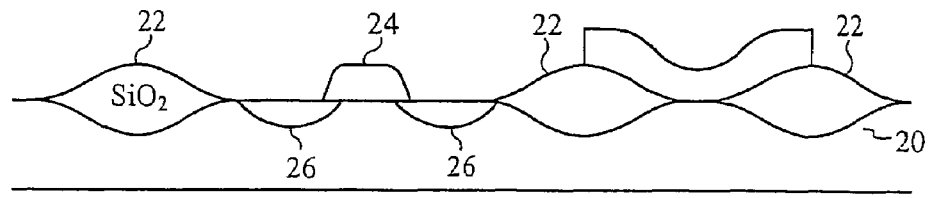
FIG. 2 illustrates an exemplary transistor configuration without interconnects.
Figure 3:
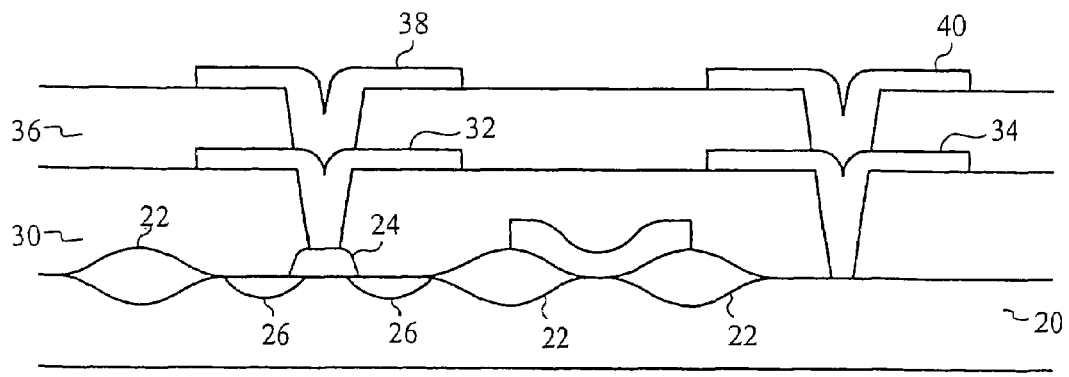
FIG. 3 illustrates the exemplary transistor configuration of FIG. 2 with interconnects.
Figure 4:
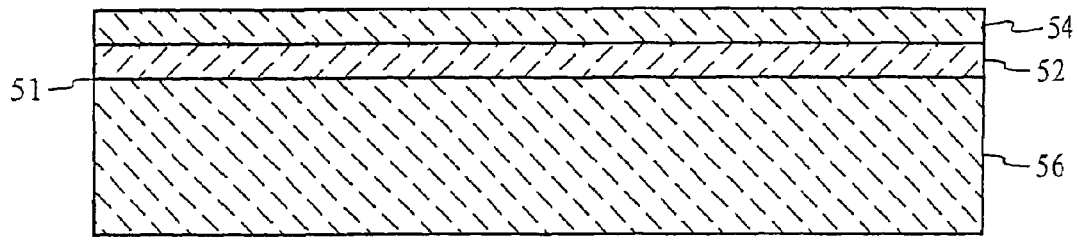
FIGS. 4–7 are cross-sections through a silicon substrate illustrating the manufacturing process of a conventional reflective, deformable, diffraction light grating.
Figure 5:
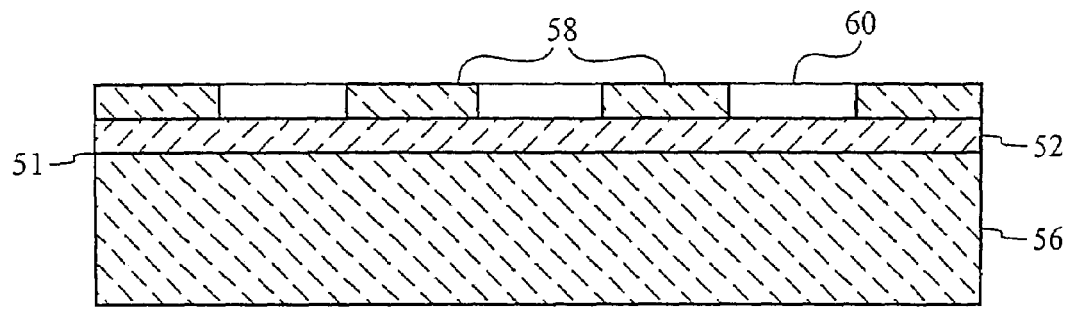
Figure 6:
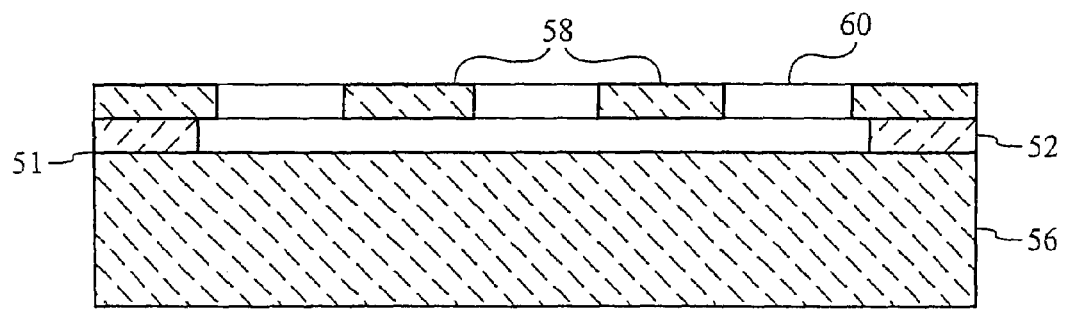
Figure 7:
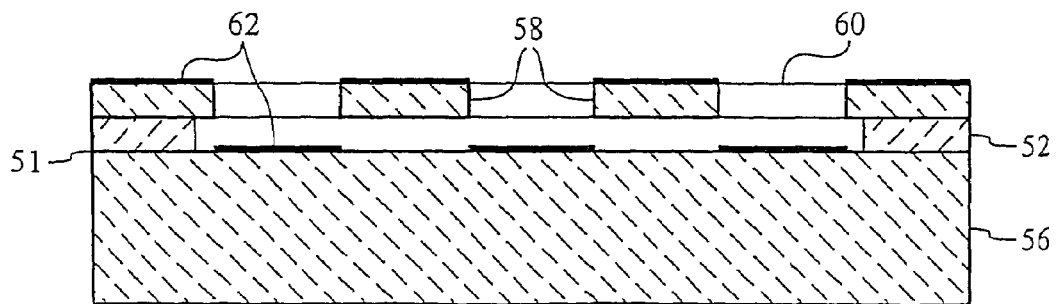
Figure 8:
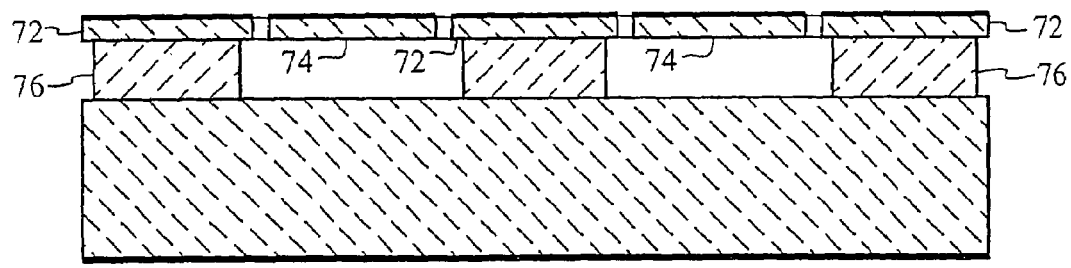
FIG. 8 is a cross-section similar to that in FIG. 7, illustrating an alternative embodiment of a conventional diffractive light grating in a non-diffracting mode.
Figure 9:
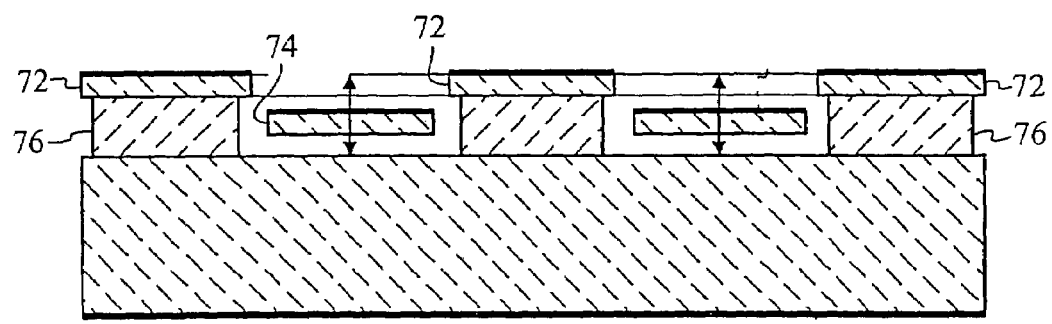
FIG. 9 is a cross-section of the diffractive light grating shown in FIG. 8, illustrating the diffractive light grating in a diffracting mode.
Figure 10:
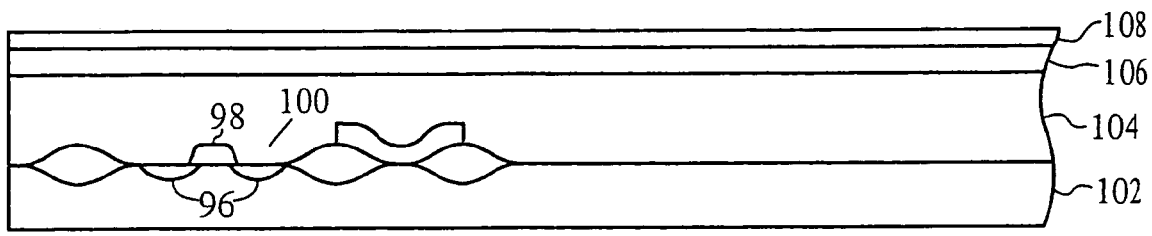
FIGS. 10–14 are cross-sections through a silicon substrate illustrating the front-end fabrication process of a monolithically integrated device according to the preferred embodiment of the present invention.

The first step in the front-end fabrication process, as illustrated in FIG. 10, is the fabrication of the front-end of a conventional MOS transistor 100. The MOS transistor 100 can be a p-type transistor or an n-type transistor. The transistor 100 is fabricated using conventional fabrication steps similar to those described above in relation to FIGS. 2 and 3. The transistor 100 includes a gate 98 and source-drains 96 fabricated onto silicon substrate 102. The configuration of transistor 100 as illustrated in FIGS. 10–20 is for illustrative purposes only and should not limit the scope of the present invention. Alternative conventional transistor configurations can be used in addition to or in replace of the transistor 100.

Following the fabrication of the front-end transistor 100 onto the silicon substrate 102 is the deposition of an oxide layer 104 on the transistor 100 and silicon substrate 102. The oxide layer 104 is then planarized, where the thickness of the oxide layer 104 is a minimum amount sufficient for adequate planarization. The preferred method of planarizing the oxide layer 104 and subsequent oxide layers is by chemical-mechanical polishing (CMP). Alternatively, any conventional method of planarizing can be used. As a result of the deposition and planarization of the oxide layer 104, the transistor 100 is sealed in a protective layer of oxide. Since the wafer is planar at this step, the wafer is in a desirable condition to begin fabrication of a front-end of the grating light valve™ light modulator. If, instead, the fabrication of the grating light valve™ light modulator is started directly on the transistor topology without first protecting the transistor 100 with the oxide layer 104, then the transistor 100 would most likely become damaged. Even if the transistor 100 were not damaged, significant processing difficulties would arise. These difficulties include removing the film from the sidewalls of the various transistor elements. Removing the thin film from sidewalls can result in plasma damage, roughering of oxide, and other deleterious effects. Overcoming these difficulties, and others, adds complexity to the grating light valve™ light modulator fabrication process. By isolating the transistor 100 within the protective layer of oxide, potential damaging aspects of the grating light valve™ light modulator fabrication process are eliminated.

Figure 11:
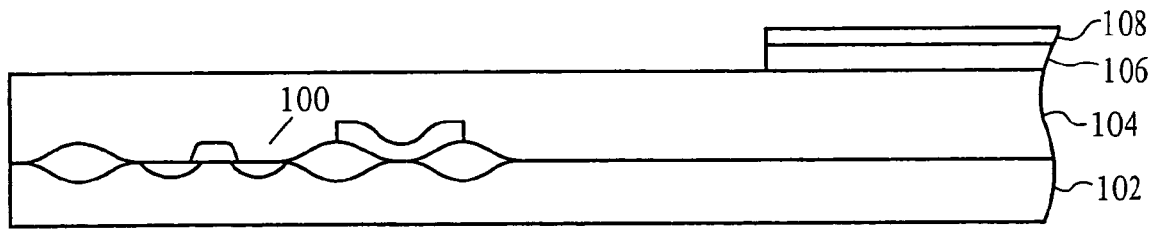

The next step is the deposition of a doped poly silicon layer on the oxide layer 104, followed by the deposition of an insulating layer, typically an oxide, on the doped poly silicon. Once patterned and etched, the poly silicon layer forms a bottom electrode 106 of the grating light valve™ light modulator, and the insulating layer forms an etch stop 108, as illustrated in FIG. 11.

Figure 12:
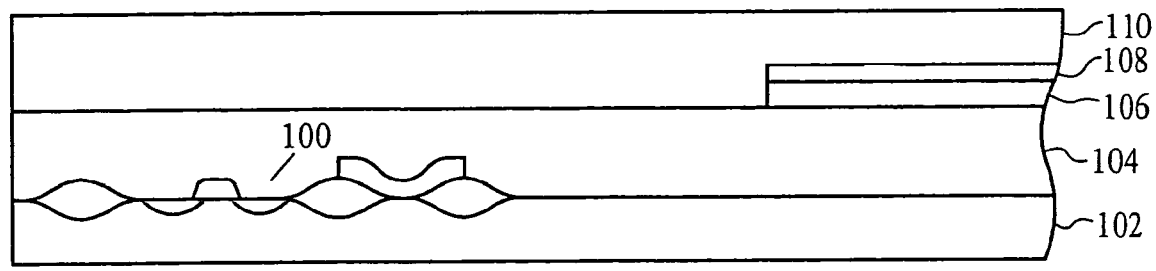
Figure 13:
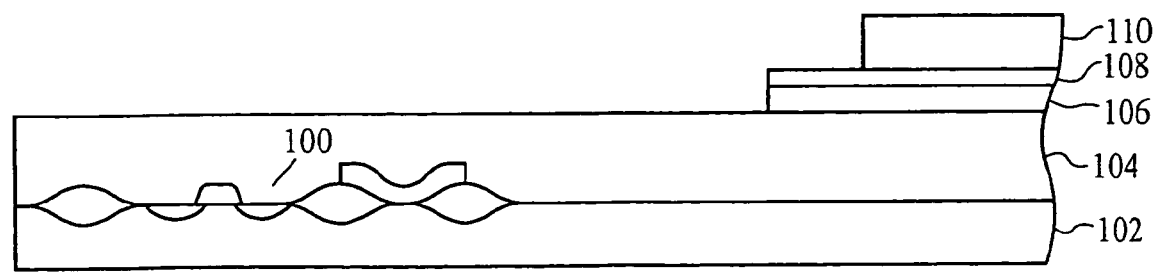
Figure 14:
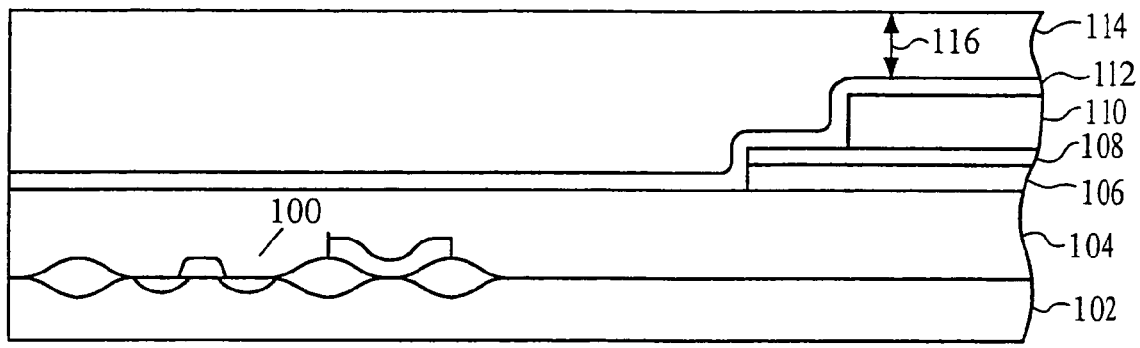

The next step, as illustrated in FIG. 12, is the deposition of a sacrificial layer 110. The sacrificial layer is then patterned and etched, as illustrated in FIG. 13. The next step, as illustrated in FIG. 14, is the deposition of a silicon nitride layer 112. The silicon nitride layer 112 is lithographically patterned into a grid of grating elements, the form of which is dependent upon the specifications of the particular grating light valve™ light modulator necessary to perform the desired modulation of a light beam incident thereto. The FIGS. 10–18 illustrate a representative cross-section of the grating light valve™ light modulator, and more particularly, and edge portion of the grating light valve™ light modulator. It should be clear that this cross-section is exemplary only is intended to aid in the understanding of the fabrication process. After this lithographic patterning process, a silicon nitride frame remains which acts as a relatively rigid support structure for some or all of the grating elements of the grating light valve™ light modulator.

The next step is the deposition of an oxide layer 114, which is then planarized. The oxide layer 114 is preferably planarized by CMP. As a result of the deposition and planarization of the oxide layer 114, the grating light valve™ light modulator is embedded in a protective layer of oxide. It is necessary that the oxide layer 114 is of a minimum thickness 116 so that a subsequent over-etching step can be performed without damaging the silicon nitride layer 112. This over-etching step will be described in a greater detail below. This completes the front-end fabrication process.

As described above, the front-end fabrication of the transistor and the front-end fabrication of the grating light valve™ light modulator are performed using high-temperature processing steps. Preferably, in the front-end of the transistor, the silicon dioxide films are grown 800–1200 degrees C., the deposition of the gate is performed at 550–650 degrees C., and the source-drains are annealed at 800–1200 degrees C. The anneal temperature is determined based on the total thermal budget of the device fabrication process. To determine the anneal temperature, the thermal budget of the low-temperature processes associated with the back-end fabrication, and the thermal budget of the grating light valve™ light modulator front-end fabrication processes are determined and subtracted from the total thermal budget. The result is the front-end transistor thermal budget. The anneal temperature is then determined based on the front-end transistor thermal budget. In the front-end of the grating light valve™ light modulator, the deposition of the doped ploy silicon layer is performed at 550–650 degrees C. with a short anneal at 800–1200 degrees C., the deposition of the insulating layer is performed at 800–1200 degrees C., the deposition of the sacrificial layer is performed at 500–650 degrees C., and the deposition of the silicon nitride layer is performed at 700–900 degrees C. Each of the aforementioned deposition steps are preferably performed using low-pressure chemical vapor deposition, or LPCVD. The preferred temperature ranges are the recommended temperature ranges for the processes described above. It is understood that other processes can be used to fabricate this or other types of transistors, where the other processes used are known to be conducted at different temperature ranges.

Figure 15:
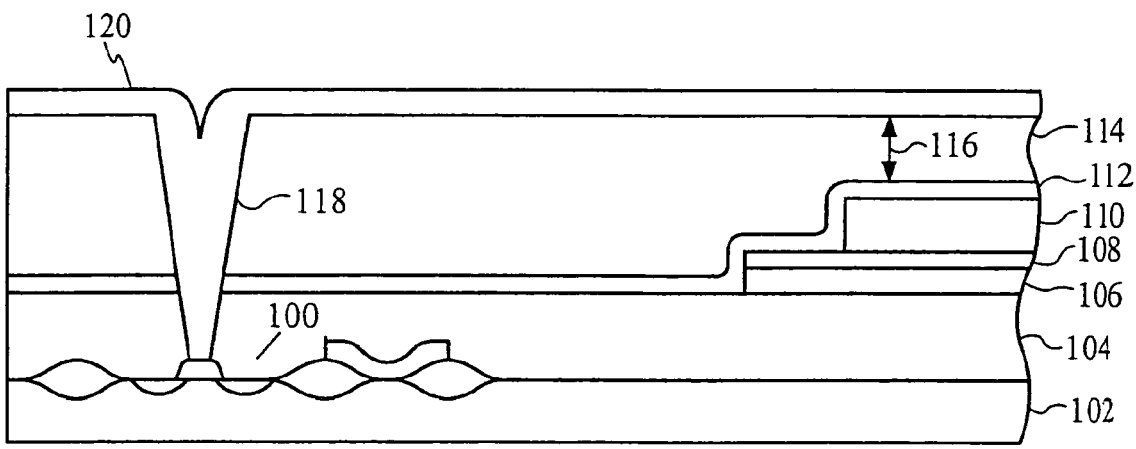
FIGS. 15–20 are cross-sections similar to that in FIGS. 10–14, illustrating the back-end fabrication process of the monolithically integrated device according to the preferred embodiment of the present invention.

The first step in the back-end fabrication process, as illustrated in FIG. 15, is the patterning and etching of a contact hole 118 to access the gate 98 of the transistor 100. The contact hole 118 includes an aspect ratio with a defined maximum, as is well known in the art. The maximum aspect ratio limits the maximum depth of the contact hole 118. It is a design consideration to account for this maximum depth when determining the thickness of the oxide layer 104 and the oxide layer 114, such that the depth of the contact hole 118 does not exceed the maximum depth permitted by the maximum aspect ratio of the contact hole 118. Following the etching of the contact hole 118 is the sputtering of a metal layer 120. Preferably, the metal is aluminum although other conductive metals can be used.

Figure 16:
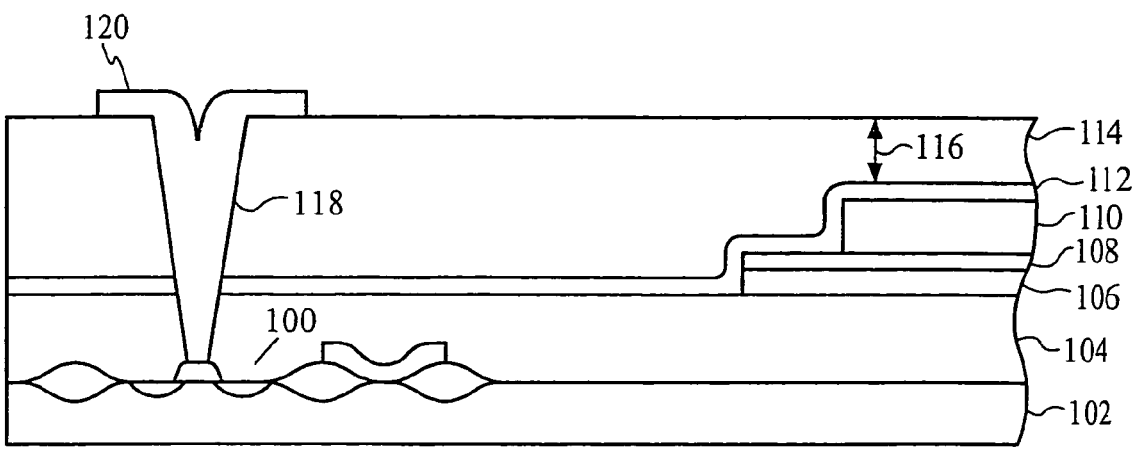

The next step, as illustrated in FIG. 16, is the patterning and etching of the metal layer 120 to form the first metal layer of an interconnect to transistor 100. Etching of the metal layer 120 is also necessary to remove the metal from the area above the grating light valve™ light modulator. To ensure that all of the metal layer 120 that is not the interconnect is removed, over-etching into the oxide layer 114 is performed. Thus the need for the minimum oxide thickness 116 of the oxide layer 114 over the grating light valve™ light modulator. The oxide thickness 116 acts as a buffer zone to allow for over-etching of the metal layer 120 without damaging the silicon nitride layer 112 of the grating light valve™ light modulator. It should be clear that after all the over-etching step is performed, the oxide thickness 116 is less than that before the over-etching step is performed.

Figure 17:
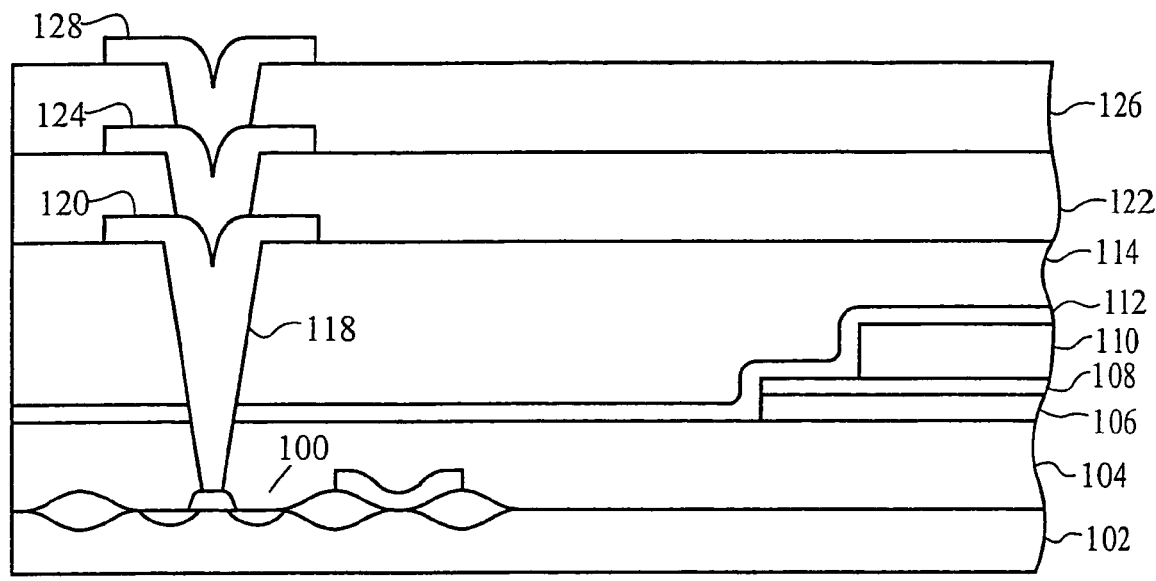

The next step, as illustrated in FIG. 17, is the deposition of an oxide layer 122. The oxide layer 122 is then planarized. The oxide layer 122 is preferably planarized by CMP. A contact hole is then patterned and etched to access the metal interconnect 120. Sputtering of another metal layer is then performed, which is then patterned and over-etched to form the second metal layer 124 of the interconnect to the transistor 100. As above, over-etching also removes the metal layer from the area above the grating light valve™ light modulator. Following the fabrication of this second metal layer, a third metal layer is fabricated by repeating the steps of depositing an oxide layer (oxide layer 126), planarizing the oxide layer (preferably by CMP), patterning and etching a contact hole (to access the metal layer 124), sputtering a metal layer, patterning and over-etching the metal layer. In this manner, the third metal layer 128 is formed and the area above the grating light valve™ light modulator is cleared of metal. The metal layers 120, 124 and 128 form an interconnect between the surface of the device and the gate 98 of the transistor 100. Although the interconnect illustrated in FIG. 17 consists of three metal layers as necessary. Preferably, 3–5 metal layers are used to form the interconnects. The Metalization layers are fabricated using low-temperature processing steps, as are well known in the art.

Figure 18:
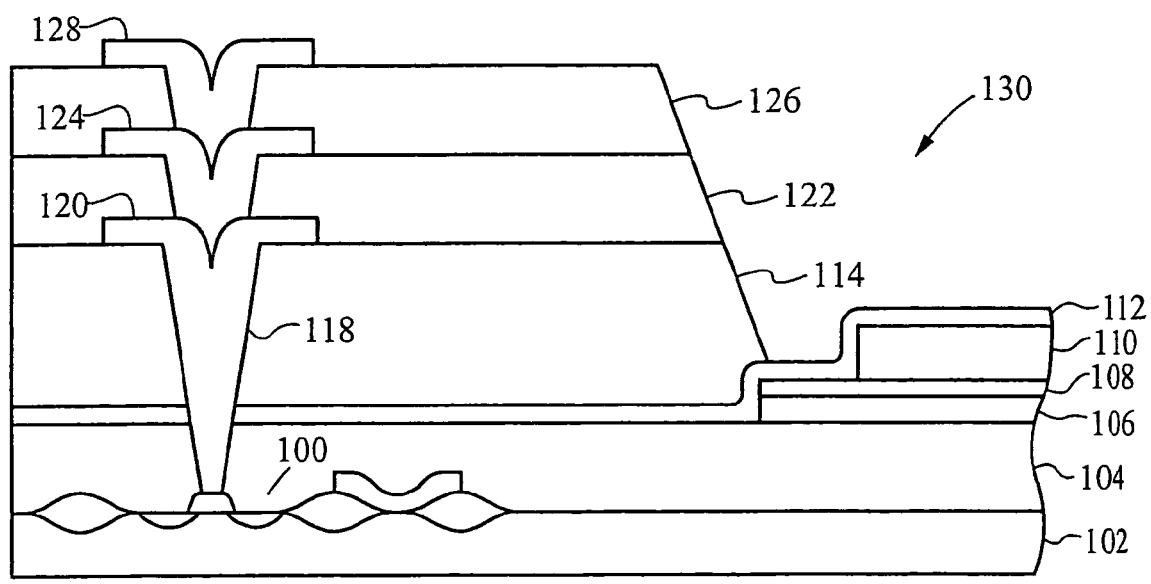

Once the interconnects for the transistor 100 are completed, all material above the grating light valve™ light modulator is to be removed. This step, as illustrated in FIG. 18, is accomplished by applying a mask called an open array mask. The open array mask acts to protect the transistor 100 and associated interconnects while enabling the material above the grating light valve™ light modulator to be removed. To remove the material above the grating light valve™ liaht modulator, a wet dip is used. Preferably, the wet dip is a buffered oxide etch (BOE) wet etch. More preferably, the wet dip is a selective 10:1 BOE wet etch. Alternatively, the wet dip can be a 20:1. BOE wet etch, a 50:1 hydrofluoric (HF) wet etch, a pad etch, ort any other similar hydrofluoric-based wet oxide etching chemistry. The wet dip enables selective etching to remove the material in an area 130 above the grating light valve™ light modulator. Once the wet dip is performed, the are 130 is cleared and the grating light valve™ light modulator is accessible.

Figure 19:
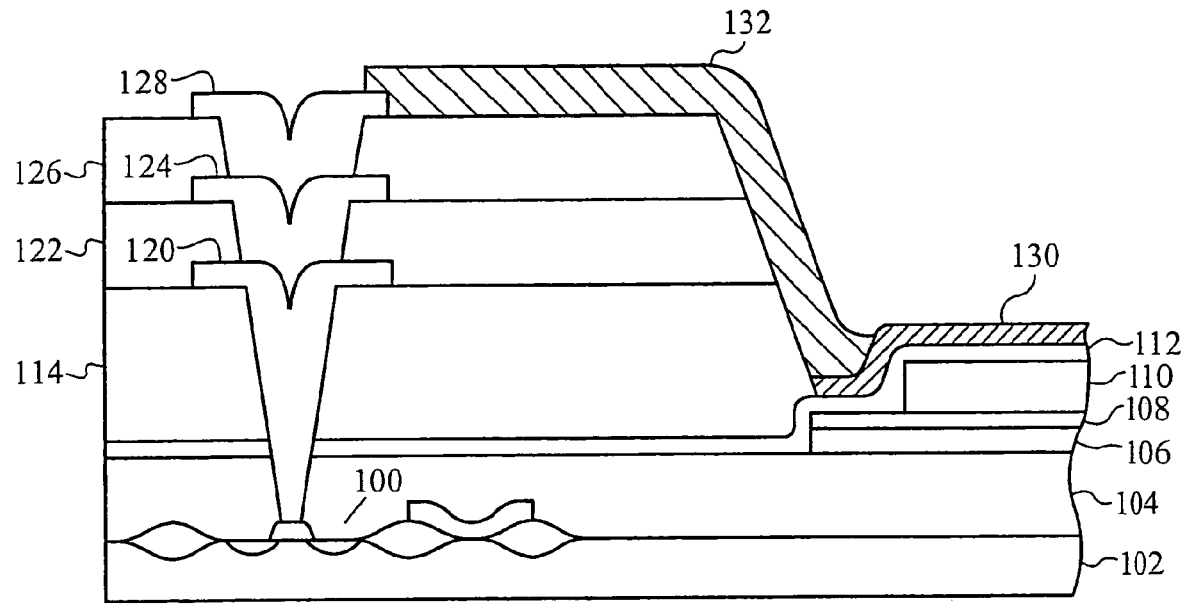
Figure 20:
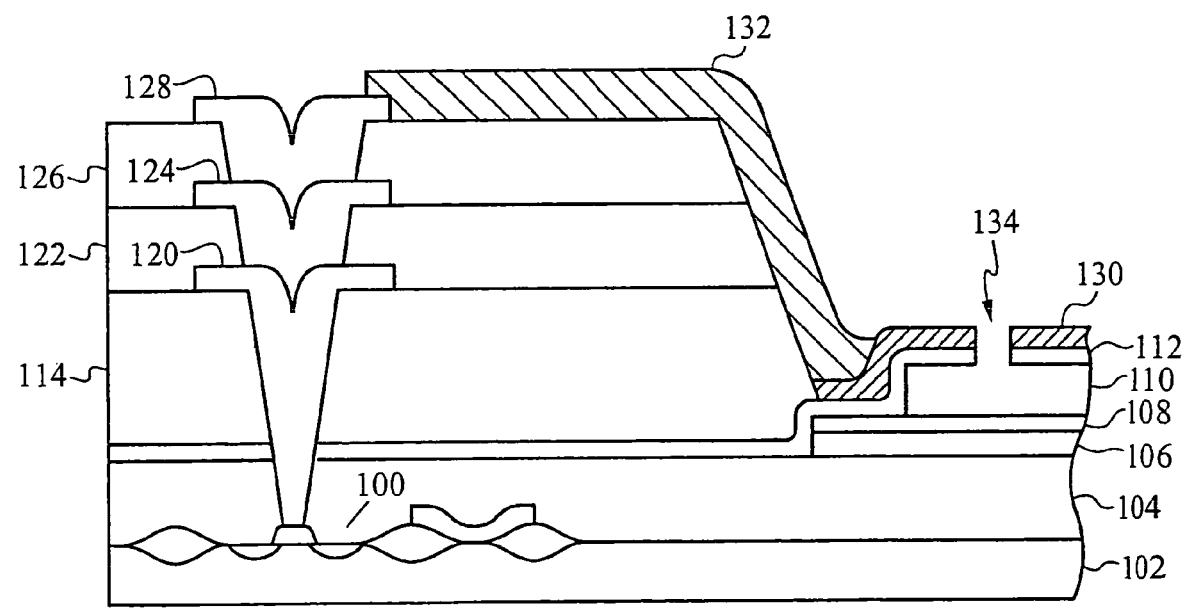

Metalization is then performed to form the reflective layers on the grating light valve™ light modulator as well as to provide the metal pathways between the grating light valve™ light modulator and the interconnects of the transistor 100. The Metalization layer on the grating light valve™ light modulator, as well as the metal pathways, are fabricated using low-temperature processing steps, which are compatible with the low-temperature processing steps used to form the metal layers of the transistor 100. After the area 130 is cleared, Metalization of the grating light valve™ light modulator is performed by sputtering, patterning and etching a reflective layer 130 onto the silicon nitride layer 112 of the grating light valve™ light modulator, as illustrated in FIG. 19. The reflective layer 130 is preferably aluminum. Then, a thick metal layer 132 is sputtered, patterned and etched to form the metal pathways between the reflective layer 130 of the grating light valve™ light modulator and the interconnects of the transistor 100. It is understood that any conventional method of metalizing the grating light valve™ light modulator and the metal pathways can be used.

The grating light valve™ light modulator is then completed by patterning and etching rib cuts 134 through selective areas of the reflective layer 130 and the silicon and the silicon nitride 112, into which XeF$_2$ is released to remove the sacrificial layer 110. A sealing process is then performed to complete the monolithically integrated device of the present invention.

There is a need to metalize the transistor separate from metalizing the grating light valve™ light modulator. This is due to the nature of the wet dip used while applying the open array mask. As discussed above, the wet dip etches the oxide layers above the grating light valve™ light modulator down to an etch stop, which is the silicon nitride layer 112. Using one of the etching chemistries described above, the selectivity of the oxide layer to silicon nitride is extremely high, on the order of 200 to 1. This is extremely effective in etching the oxide layer down to silicon nitride layer 112. However, these etching chemistries also etch metal to a large degree, particularly the thin and high quality metal deposited on the grating light valve™ light modulator. Therefore, it is advantageous to not metalize the grating light valve™ light modulator while metalizing the transistor. If the grating light valve™ light modulator were metalized prior to applying the open array mask, then the etchant would etch the grating light valve™ light modulator metal. Instead, after the transistor interconnects are formed, the open array mask with wet dip is applied to remove the oxide layers covering the front-end of the grating light valve™ modulator, and then the reflective layers of the grating light valve™ light modulator and the metal pathways are formed.

The monolithically integrated device and the fabrication process associated therewith has been described related to a single transistor 100. This description is for illustrative purposes only and it should be clear that the preferred embodiment of the present invention includes a plurality of transistors and associated interconnects. It should also be clear that although the present invention has been described as including a single interconnect to gate 98, additional interconnects including the interconnects to the plurality of transistors are also included as required by the design considerations of the device. Additional interconnects to the silicon substrate can also be included, for example.

We claim:

1. An integrated device comprising:
   a transistor formed on a substrate;
   a light modulator formed over a protective layer that is configured to protect the transistor during fabrication of the light modulator, the protective layer overlying the transistor, the light modulator comprising a reflective layer movable towards a bottom electrode, the bottom electrode being located between the reflective layer and the substrate;
   a support structure formed over the protective layer, the support structure configured to support the reflective layer;
   a dielectric layer formed over the support structure;
   a contact hole through the support structure and the dielectric layer, the reflective layer being coupled to the transistor through the contact hole;
   wherein the transistor is configured to drive the light modulator and the light modulator is monolithically integrated with the transistor on the substrate.

2. The integrated device of claim 1 wherein the substrate comprises silicon.

3. The integrated device of claim 1 wherein the light modulator comprises a diffractive light modulator.

4. The integrated device of claim 1 wherein the reflective layer comprises aluminum.

5. The integrated device of claim 1 wherein the transistor comprises an MOS transistor.

6. The integrated device of claim 1 wherein the protective layer comprises silicon dioxide.

7. The integrated device of claim 1 wherein the reflective layer is on a layer of silicon nitride.

8. The integrated device of claim 1 wherein the bottom electrode comprises a doped poly silicon.

9. An integrated device comprising:
   a light modulator, the light modulator comprising a movable structure suspended over and movable towards a bottom electrode, the light modulator comprising a reflective layer formed over a support structure, the bottom electrode being located between the reflective layer and a substrate;
   a dielectric layer over the support structure;
   a protective layer over a transistor;
   a contact hole through the support structure, through the dielectric layer, and through the protective layer, the reflective layer being coupled to the transistor through the contact hole;
   wherein the transistor is monolithically integrated with the light modulator on the a same substrate.

10. The integrated device of claim 9 wherein the movable structure comprises a layer of aluminum on a layer of silicon nitride.

11. The integrated device of claim 9 wherein the substrate comprises silicon.

12. The integrated device of claim 9 wherein the light modulator comprises a diffractive light modulator.

13. The integrated device of claim 9 wherein the bottom electrode comprises a doped poly silicon.

14. The integrated device of claim 9 wherein the protective layer comprises silicon dioxide.

15. The integrated device of claim 9 wherein a gate of the transistor is on a plane that is between the bottom electrode and the substrate.

16. The integrated device of claim 1 wherein one end of the reflective layer is coupled to the transistor through the contact hole.

* * * * *